United States Patent
Rasp et al.

(10) Patent No.: US 9,521,747 B2
(45) Date of Patent: Dec. 13, 2016

(54) CONNECTION BOARD, OPTOELECTRONIC COMPONENT ARRANGEMENT AND ILLUMINATION DEVICE

(71) Applicant: OSRAM Opto Semiconductors GmbH, Regensburg (DE)

(72) Inventors: Michael Rasp, Nittendorf (DE); Konrad Wagner, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/363,823

(22) PCT Filed: Dec. 14, 2012

(86) PCT No.: PCT/EP2012/075614
§ 371 (c)(1),
(2) Date: Jun. 9, 2014

(87) PCT Pub. No.: WO2013/092435
PCT Pub. Date: Jun. 27, 2013

(65) Prior Publication Data
US 2014/0345918 A1    Nov. 27, 2014

(30) Foreign Application Priority Data
Dec. 22, 2011 (DE) .......... 10 2011 056 890

(51) Int. Cl.
*H05K 1/02* (2006.01)
*H05K 1/05* (2006.01)
(Continued)

(52) U.S. Cl.
CPC .......... *H05K 1/0296* (2013.01); *F21V 19/0005* (2013.01); *H05K 1/0268* (2013.01);
(Continued)

(58) Field of Classification Search
CPC .... H05K 1/0296; H05K 1/115; F21V 19/0005
(Continued)

(56) References Cited

U.S. PATENT DOCUMENTS 6,395,999 B1 * 5/2002 Ploix ........................... 174/260
2007/0117417 A1 * 5/2007 O'Brien ................. H05K 1/142
439/65

(Continued)

FOREIGN PATENT DOCUMENTS

| CN | 1759640 | 4/2006 |
|----|---------|--------|
| CN | 101945536 | 1/2011 |

(Continued)

OTHER PUBLICATIONS

Chinese First Office Action dated May 24, 2016, of corresponding Chinese Application No. 201280063765.9 in English.

*Primary Examiner* — Hoa C Nguyen
*Assistant Examiner* — Amol Patel
(74) *Attorney, Agent, or Firm* — DLA Piper LLP (US)

(57) ABSTRACT

A connection board includes at least one cut-out to fasten the connection board to an installation board and multiple contact surfaces electrically isolated from one another, wherein the contact surfaces electrically connect to one another when the connection board is in a fastened state by a fastener that extends through the cut-out.

20 Claims, 2 Drawing Sheets

(51) Int. Cl.
*F21V 19/00* (2006.01)
*H05K 1/11* (2006.01)
*H05K 3/00* (2006.01)
*F21Y 101/00* (2016.01)

(52) U.S. Cl.
CPC ............... *H05K 1/05* (2013.01); *H05K 1/115* (2013.01); *H05K 3/0061* (2013.01); *F21V 19/003* (2013.01); *F21Y 2101/00* (2013.01); *H01L 2224/48091* (2013.01); *H01L 2224/73265* (2013.01); *H05K 2201/0949* (2013.01); *H05K 2201/09463* (2013.01); *H05K 2201/09663* (2013.01); *H05K 2201/10106* (2013.01); *H05K 2201/10409* (2013.01); *H05K 2201/10886* (2013.01); *H05K 2203/162* (2013.01); *H05K 2203/173* (2013.01)

(58) Field of Classification Search
USPC ....... 174/520, 535, 250, 255, 260, 261, 262; 361/748, 752
See application file for complete search history.

(56) References Cited

U.S. PATENT DOCUMENTS

| | | | |
|---|---|---|---|
| 2007/0211433 A1* | 9/2007 | Maeno | 361/704 |
| 2009/0166895 A1 | 7/2009 | Noguchi et al. | |
| 2011/0031985 A1* | 2/2011 | Johnson | 324/681 |
| 2013/0081867 A1* | 4/2013 | Masuda | 174/260 |

FOREIGN PATENT DOCUMENTS

| | | | |
|---|---|---|---|
| DE | 28 37 318 A1 | 3/1980 | |
| DE | 33 31 886 A1 | 4/1985 | |
| DE | 34 47 130 A1 | 6/1986 | |
| DE | 86 19 667 | 4/1991 | |
| DE | 200 22 418 U1 | 11/2001 | |
| EP | 2 096 713 A2 | 9/2009 | |
| EP | 2096713 A2 * | 9/2009 | |
| JP | WO 2010071131 A1 * | 6/2010 | ........... H05K 1/0268 |
| WO | 2010/046339 A1 | 4/2010 | |
| WO | 2010/071131 A1 | 6/2010 | |

* cited by examiner

CONNECTION BOARD, OPTOELECTRONIC COMPONENT ARRANGEMENT AND ILLUMINATION DEVICE

TECHNICAL FIELD

This disclosure relates to a connection board, an optoelectronic component arrangement and an illumination device.

BACKGROUND

To increase the total radiated power emitted by an optoelectronic component arrangement, it is possible to provide multiple optoelectronic components connected to one another by way of a common anode and a common cathode. During operation of the component arrangement, it is possible for differences in the forward voltages that occur at the individual components to cause individual components to become overloaded. This can cause premature failure of one of the components or of the entire component arrangement.

It could therefore be helpful to improve reliability by a connection board and, accordingly, a component arrangement.

SUMMARY

We provide a connection board including at least one cut-out to fasten the connection board to an installation board and multiple contact surfaces electrically isolated from one another, wherein the contact surfaces electrically connect to one another when the connection board is in a fastened state by a fastener that extends through the cut-out.

We also provide an optoelectronic component arrangement including a connection board including a first contact surface and a second contact surface electrically isolated from the first contact surface, a first component that generates radiation and electrically conductively connects to the first contact surface, and a second component that generates radiation and electrically conductively connects to the second contact surface, wherein the first contact surface and the second contact surface electrically connect to one another when the connection board is in a fastened state on an installation board.

We further provide an illumination device having at least one component arrangement including a connection board including a first contact surface and a second contact surface electrically isolated from the first contact surface, a first component that generates radiation and electrically conductively connects to the first contact surface, and a second component that generates radiation and electrically conductively connects to the second contact surface, wherein the first contact surface and the second contact surface electrically connect to one another when the connection board is in a fastened state on an installation board and having an installation board on which the component arrangement is fastened by at least one fastener such that the first contact surface and the second contact surface electrically connect to one another.

DETAILED DESCRIPTION

Figure 1:
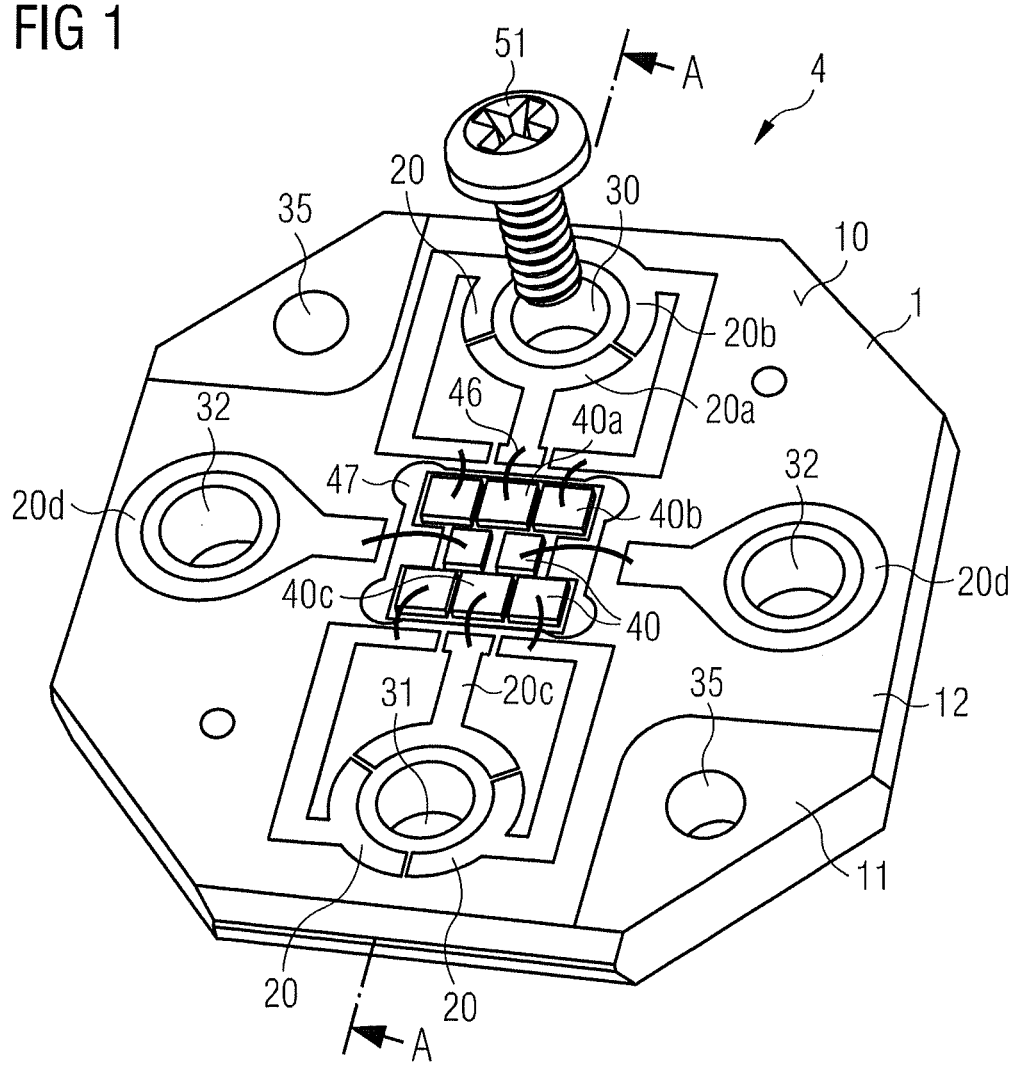
FIG. 1 illustrates a schematic perspective view of an example for a component arrangement having a connection board.

Our connection boards may comprise at least one cut-out to fasten the connection board to an installation board and at least two contact surfaces electrically isolated from one another. The contact surfaces are provided for the purpose of being electrically connected to one another when the connection board is actually fastened by a fastener that extends through the cut-out.

The contact surfaces are provided for the purpose of electrically contacting optoelectronic components arranged on the connection board, in particular, components provided to generate radiation. Prior to fastening the connection board by the fastener, the components allocated to the respective contact surfaces can be electrically contacted independently from the components allocated to one other contact surface. It is preferred that each contact surface is allocated precisely one component. The components can therefore be individually electrically contacted by the contact surfaces electrically isolated from one another.

It is therefore also possible to test the components individually, by way of example with respect to their forward voltage once they are fastened to the connection board. Once the connection board is fastened to the installation board, the components connected to the contact surfaces electrically connect to one another so that multiple components, in particular, all components arranged on the connection board can be electrically contacted by a common contact and a common counter contact. The common contact is therefore formed by the contact surfaces electrically isolated from one another on the connection board and electrically connected to one another by one fastener or multiple fasteners. The common counter contact can be formed as a continuous surface on which the components are arranged one adjacent to the other and contacted. Deviating from that, the counter contact may also comprise a plurality of counter contact surfaces in particular connected in an electrically conductive manner to one another. It is preferred that each component is allocated precisely one counter contact surface. The electrical connection between the components and the counter contacts can be performed by way of example by solder or an electrically conductive adhesive, by a contacting elevation (bump) or by a connecting line, by way of example a bond wire.

It is not necessary to produce the electrical contact for the fastener itself to be directly adjacent to the contact surfaces. By way of example, it is possible when the connection board is in the fastened state for the fastener to press a separate contact element against at least two contact surfaces isolated from one another and, thus, to produce an electrically conductive connection. The fastener is preferably designed to be electrically conductive. However, when using a separate contact element, an electrically insulating fastener can also be used.

The fastener is preferably provided for a non-positive connection with the installation board. Furthermore, the connection is preferably designed to be detachable. By way of example, the fastener can be a screw. The head of the screw can produce directly or indirectly the electrical contact between the allocated contact surfaces. By way of example, the head of the screw can press a contact element against the contact surfaces. However, the contact element can also have a geometry different from a rotationally symmetrical shape.

Preferably, the connection board is a circuit board. Further preferably, the circuit board comprises a metal body and an insulation layer arranged on the metal body. The contact surfaces are preferably arranged on that side of the insulation layer remote from the metal body and electrically isolated from the metal body. Waste heat generated during operation can be effectively dissipated from the components by way of the metal body. However, a different circuit board, by way of example an FR2 or FR4 circuit board, or a ceramic board or a part of a housing can also be used for the connection board.

Further preferably, the contact surfaces can be arranged on a front face of the connection board and a rear face of the connection board is provided to fasten to the installation board, the rear face lying opposite the front face. The components are preferably arranged exclusively on the front face of the connection board.

Preferably, the contact surfaces extend around the cut-outs in sections in the shape of ring segments. Each contact surface allocated to a cut-out, therefore, forms a segment of a ring-like basic shape, wherein the segments are spaced apart from one another. The terms "in the shape of ring segments" and "ring-like" do not represent any limitation with respect to a rotationally symmetrical basic shape of the segments. A rotationally symmetrical basic shape of this type is, however, particularly suitable especially in the case of a circular cut-out.

An optoelectronic component arrangement may comprise a connection board that comprises a first contact surface and a second contact surface electrically isolated from the first contact surface. Furthermore, the component arrangement comprises a first component provided to generate radiation and connects in an electrically conductive manner to the first contact surface, and a second component provided to generate radiation and connects in an electrically conductive manner to the second contact surface. The first contact surface and the second contact surface connect in an electrically conductive manner to one another when the connection board is in the fastened state on an installation board.

Preferably, the first component and the second component connect in an electrically conductive manner to a common counter contact. The first component and the second component can be electrically contacted separately from one another by providing an electrical voltage between the counter contact and the first contact surface or between the counter contact and the second contact surface, respectively. The components can be contacted one after the other or simultaneously.

Preferably, the connection board comprises a metal body and an insulation layer arranged on the metal body. The first contact surface and the second contact surface are preferably arranged on a side of the insulation layer, the side being remote from the metal body.

It is further preferred that the metal body forms the common counter contact. The components can be fastened directly to the metal body by a connecting layer, by way of example by a solder layer or an electrically conductive adhesive. It is preferred that the metal body comprises a fastening region provided to fasten the components and is not covered. In other words, the insulation layer is removed in this region.

Expediently, the first component and the second component can be electrically contacted independently from one another prior to being fastened to the installation board by the first contact surface or the second contact surface, respectively. It is further preferred that the first component and the second component are provided for an operation connected in an electrically parallel manner one to the other. Although the components of the component arrangement are, therefore, provided for a parallel operation, at least some components, preferably all components, can still be individually electrically contacted in the finished component arrangement.

The number of components and the number of contact surfaces can be varied within a wide range. It is preferred that each contact surface is allocated precisely one component, wherein each contact surface is electrically isolated from the other contact surfaces prior to fastening the connection board. The contact surfaces can be allocated to one or multiple cut-outs. Contact surfaces allocated to one cut-out can preferably be electrically connected to one another by precisely one fastener when the connection board is in the fastened state.

The first component and the second component preferably comprise at least one semiconductor chip provided to generate radiation and is by way of example a luminescent diode chip, possibly a light-emitting diode chip or a laser diode chip.

It is preferred that the components are bare semiconductor chips. The semiconductor chips can be connected in an electrically conductive manner to the respective allocated contact surface by way of example by a connecting line, possibly a bond wire. In particular, the semiconductor chip can comprise a rear-face contact surface to contact the counter contact and a front-face contact surface to contact one of the contact surfaces. However, it is also possible to use a semiconductor chip that comprises two front-face contact surfaces or two rear-face contact surfaces. The rear face refers in this case to the face facing the connection board and the front face refers to that face of the semiconductor chip remote from the connection board.

Alternatively, the optoelectronic components can also be surface-mounted devices (SMD) having a housing. An illumination device may comprise at least one component arrangement and an installation board on which the component arrangement is fastened by at least one fastener such that the first contact surface and the second contact surface electrically connect to one another.

The components electrically connected to the first contact surface and the second contact surface are consequently connected electrically parallel to one another during operation of the illumination device and, furthermore, can preferably be electrically contacted by a common contact and a common counter contact.

Preferably, the connection board comprises a further cut-out. Furthermore, the connection board comprises at least a third contact surface connected in an electrically conductive manner to a third component. The connection board is fastened to the installation board by a further fastener so that the first contact surface connects in an electrically conductive manner to the third contact surface by way of the first fastener, the installation board and the further fastener. The fastener and the further fastener may be electrically conductive. In other words, contact surfaces allocated different cut-outs connect in an electrically conductive manner to one another by way of the fastener, which are allocated to the cut-outs, and the installation board. A common contact for the components is thus produced in a simpler manner.

The fastener and, if applicable, the further fastener are preferably electrically isolated from the connection board. By way of example, it is possible to arrange in the cut-out and, if applicable, in the further cut-out a sleeve for the purpose of electrically insulating the fastener from the connection board.

The described connection board is particularly suitable for the described component arrangement. Furthermore, the described component arrangement is particularly suitable for the described illumination device. Features described in relation to the illumination device can therefore also be used for the component arrangement or for the connection board or vice versa.

Further features and expedient measures are evident in the following description of examples in conjunction with the figures.

Like, similar or like-functioning elements are designated by like reference numerals in the figures. The figures and the size ratios between the elements illustrated in the figures are not to be regarded as being to scale. On the contrary, the size of individual elements can be exaggerated to better illustrate and/or to facilitate understanding of our connection boards, arrangements and devices.

Figure 2:
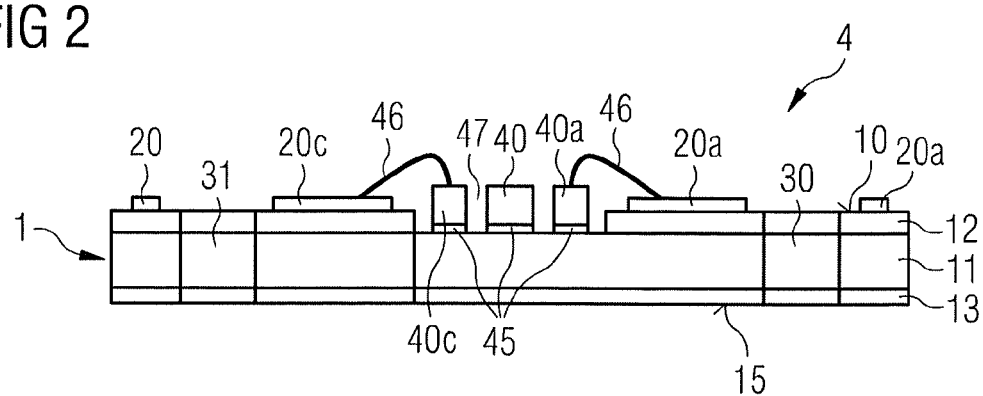
FIG. 2 illustrates a schematic sectional view of the component arrangement illustrated in FIG. 1.

FIG. 1 illustrates a schematic perspective view of an example of a component arrangement 4. A schematic sectional view of the component arrangement along the line AA' is illustrated in FIG. 2.

The component arrangement 4 comprises a connection board 1. By way of example, a total of eight contact surfaces 20 are arranged on a front face 10 of the connection board. The contact surfaces 20 electrically connect to an optoelectronic component 40 by a connection line 46, by way of example a bond wire. For a simplified description, a first contact surface 20a and an allocated first component 40a, a second contact surface 20b and an allocated second component 40b, a third contact surface 20c and an allocated third component 40c and a fourth contact surface 20d are provided with a dedicated reference numeral.

A cut-out 30, a further cut-out 31 and additional cut-outs 32 are provided in the connection board 1. The cut-outs extend in the vertical direction from the front face 10 to a rear face 15 of the connection board, the rear face lying opposite the front face. The cut-outs can be by way of example bores.

The cut-out 30 is surrounded by a total of three contact surfaces 20, wherein the first contact surface 20a connects in an electrically conductive manner to the first component 40a and the second contact surface 20b connects in an electrically conductive manner to a second component 40b.

The connection board 1 comprises a metal body 11 covered in sections by an insulating layer 12. The insulation layer 12 is provided for the purpose of electrically insulating the metal body 11 from the contact surfaces 20 arranged on that side of the insulation layer 12 that lies opposite the metal body.

The metal body 11 is not covered in a fastening region 47. The components 40 are fastened to the metal body 11 in this region. The components are preferably fastened by an electrically conductive connecting layer 45, by way of example a solder layer or an electrically conductive adhesive (cf. FIG. 2).

The metal body 11 of the connection board 1 is therefore used as a common counter contact for the components 40 arranged on the connection board.

Once the components 40 have been fastened to the connection board 1 and electrical contact has been made with the contact surfaces 20 by the connecting lines 46, the components can be electrically contacted individually from one another by applying an electrical voltage between the counter contact and the contact surface 20 allocated to the component, and the components can be operated independently from one another for testing purposes. By way of example, the forward voltage can be determined individually for each component 40. In the event that a component deviates too greatly with respect to an operating parameter such as, for example, the forward voltage, this component can be replaced. In this manner, it is possible to ensure even when in the assembled state on the connection board 1 that the components 40 arranged on the connection board fulfill the required optoelectronic characteristics. It is thus possible to increase reliability of the component arrangement, by way of example with respect to a premature failure of a component.

The cut-out 30 and the further cut-out 31 are allocated three contact surfaces 20 that extend around the cut-outs 30, 31 in the shape of a ring segment. The third contact surface 20c allocated to the further cut-out 31 connects in an electrically conductive manner to a third component 40c. When the component arrangement 4 is in the assembled state with the connection board 1 by a fastener 51, by way of example a screw, the contact surfaces allocated to the respective cut-out connect in an electrically conductive manner to one another.

A fourth contact surface 20d is allocated as a sole contact surface to the additional cut-outs 32.

Furthermore, openings 35 are formed in the connection board 1. The openings are arranged in the region of the connection board 1 in which the metal body 11 is not covered. An external electrical contact is made with the metal body 11 by these openings 35.

The metal body 11 can contain by way of example copper or aluminum or it can also consist of a material of this type. A synthetic material possibly an epoxide or an acrylate is by way of example suitable for the insulation layer 12.

The connection board 1 comprises a further insulation layer 13 on the rear face 15. When the connection board is in the fastened state on an installation board, the metal body 11 is isolated from the installation board by the further insulation layer. However, it is also possible to omit a further insulation layer 13 of this type depending upon the design of the installation board.

Naturally, the number of components 40, the contact surfaces 20 and the cut-outs 30 can be varied within a wide range. By way of example, one cut-out can be allocated between one and including one and ten and including ten contact surfaces. Furthermore, in a different manner to that of the described example, the connection board can also be a flexible or rigid circuit board without a metal body, by way of example as a FR2 or FR4 circuit board. A ceramic board or a part of a housing of the component arrangement can also be used for the connection board.

It is also possible in a different manner to the described example to use for the semiconductor chips semiconductor chips that comprise two front-face contact surfaces or two rear-face contact surfaces. In this case, the counter contact preferably comprises a plurality of counter contact surfaces connected in an electrically conductive manner to one another and connect in an electrically conductive manner to one component. The counter contact surfaces can be in particular on that face of the insulation layer remote from the metal body. When producing the connection board, the contact surfaces and the counter contact surfaces can be produced simultaneously, by way of example by virtue of being structured from a common contiguous layer or deposition.

Figure 3:
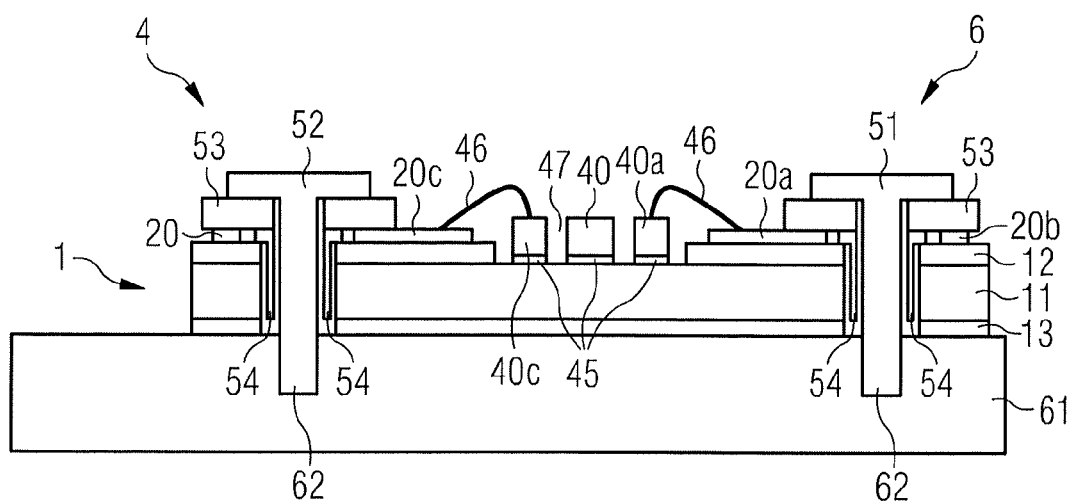
FIG. 3 illustrates a schematic sectional view of an example for an illumination device.

FIG. 3 illustrates a schematic sectional view of an example for an illumination device 6. The illumination device 6 comprises a component arrangement 4 as described in relation to FIGS. 1 and 2. The component arrangement 4 is arranged on an installation board 61 and connects in a non-positive manner to the installation board by a fastener 51 and a further fastener 52. A fastener is likewise provided in the cut-outs 32 illustrated in FIG. 1 so that a fastener 51 is allocated to each contact surface 20 and all contact surfaces 20 connect in an electrically conductive manner to the installation board 61 by way of the associated fastener. The fastener can be by way of example screws. During the assembly process, the fastener 51 can produce directly an electrically conductive connection between the first contact surface 20a and the second contact surface 20b or the electrically conductive connection can, as illustrated in FIG. 3, be formed by a contact element 53, by way of example an insert washer, which is pressed by the fastener against the respective contact surfaces.

The first contact surface 20a connects in an electrically conductive manner to the third contact surface 20c by way of the fastener 51, the installation board 61 and the further fastener 52. The first component 40a and the third component 40c consequently connect electrically parallel to one another during operation of the illumination device and can be contacted jointly by two external contacts.

For the purpose of fastening the connection board, cut-outs 62 are provided in the installation board 61 for the fastener 51, 52. The cut-outs can be by way of example threaded stud holes.

To electrically insulate the fastener 51, 52, a sleeve 54 consisting of an electrically insulating material is arranged between the fastener and the metal body 11, respectively. A suitable material for the sleeve is by way of example a synthetic material, possibly polytetrafluoroethylene (PTFE).

As a result of mechanically fastening the component arrangement 4 to the installation board 61 by the fastener 51, 52, an electrically conductive connection of all contact surfaces is consequently provided simultaneously so that the components 40 connected to the contact surfaces connect in parallel to one another during operation of the illumination device 6. Immediately prior to the fastening process, it is still possible to electrically contact individually from one another the components 40 that are already fastened to the connection board 1 so that it is possible to test the components.

The components 40 are in the illustrated example bare optoelectronic semiconductor chips. However, in a different manner thereto, it is also possible to use components where the semiconductor chips are installed in a housing. In general, the described example having multiple contact surfaces isolated from one another is suitable for component arrangements where multiple components are provided for a parallel operation and where the characteristics of the multiple components are to be tested separately from one another.

Furthermore, it can also be expedient in a different manner to the described example to provide, in place of a common counter contact, multiple counter contact surfaces to which in each case at least one component is allocated.

The fastener 51 can also be used in a different manner to the described example not only to supply current to the components, but also merely to produce an electrically conductive connection between contact surfaces allocated to a fastener. The fastener can then be electrically insulating and by way of example can press a separate contact element against the contact surfaces during the process of assembling the component arrangement.

Furthermore, it is also possible in a different manner to the described example that just one single fastener is also sufficient. All the contact surfaces to be contacted individually prior to the fastening process can be allocated to this fastener.

Our connection boards, arrangements and devices are not limited by the description with reference to the examples. On the contrary, this disclosure encompasses each new feature and each combination of features that in particular each combination of features in the appended claims includes, even if the feature or combination itself is not explicitly disclosed in the claims or the examples.

The invention claimed is:

1. An optoelectronic component arrangement comprising:
   a connection board comprising a first contact surface,
   a second contact surface electrically isolated from the first contact surface, and at least one cut-out to fasten the connection board to an installation board and multiple contact surfaces electrically isolated from one another, wherein the first contact surface and the second contact surface electrically connect to one another when the connection board is in the fastened state by a fastener that extends through the cut-out,
   a first component that generates radiation and electrically conductively connects to the first contact surface, and
   a second component that generates radiation and electrically conductively connects to the second contact surface,
   wherein the first contact surface and the second contact surface electrically connect to one another when the connection board is in a fastened state on the installation board,
   the first component and the second component comprise at least one luminescent diode chip, and
   the fastener non-positively connects with the installation board.

2. The optoelectronic component arrangement according to claim 1, wherein the connection board is a circuit board.

3. The optoelectronic component arrangement according to claim 2, wherein the circuit board comprises a metal body and an insulation layer arranged on the metal body.

4. The optoelectronic component arrangement according to claim 1, wherein the first contact surface and the second contact surface are arranged on a front face of the connection board and a rear face of the connection board is provided for fastening to the installation board, said rear face lying opposite the front face.

5. The optoelectronic component arrangement according to claim 1, wherein first contact surface and the second contact surface extend around the cut-out in sections in a ring shape segment.

6. The component arrangement according to claim 1, wherein the first component and the second component electrically conductively connect to a common counter contact.

7. The component arrangement according to claim 6, wherein:
   the connection board comprises a metal body and an insulation layer arranged on the metal body;
   the metal body forms the common counter contact; and
   the first contact surface and the second contact surface are arranged on a side of the insulation layer, said side being remote from the metal body.

8. The component arrangement according to claim 1, wherein the first component and the second component are electrically contactable independently from one another prior to being fastened to the installation board.

9. The component arrangement according to claim 1, wherein the first component and the second component electrically connect parallel to one another.

10. The component arrangement according to claim 1, wherein the first component and the second component are bare semiconductor chips.

11. An illumination device having at least one component arrangement according to claim 1 and having an installation board on which the component arrangement is fastened by at least one fastener such that the first contact surface and the second contact surface electrically connect to one another.

12. The illumination device according to claim 11, wherein:
the connection board comprises a cut-out and a further cut-out;
the connection board comprises at least a third contact surface electrically conductively connected to a third component;
the connection board is fastened to the installation board by a further fastener, so that the first contact surface electrically conductively connects to the third contact surface by way of the first fastener, the installation board and the further fastener.

13. The illumination device according to claim 11, wherein a sleeve that electrically insulates the fastener from the connection board is arranged in the cut-out.

14. An optoelectronic component arrangement comprising:
a connection board comprising a first contact surface and a second contact surface electrically isolated from the first contact surface,
a first component that generates radiation and electrically conductively connects to the first contact surface, and
a second component that generates radiation and electrically conductively connects to the second contact surface,
wherein
the first component and the second component are luminescence diode chips,
the first component and the second component are electrically contactable independently from one another prior to being fastened to the installation board,
the first component and the second component electrically connect in parallel to one another via the first contact surface and the second contact surface when the connection board is in a fastened state on an installation board.

15. The optoelectronic component arrangement according to claim 14, wherein the first contact surface and the second contact surface directly connect to one another via a fastener extending through the cut-out or via a contact element pressed against the first contact surface and the second contact surface by the fastener.

16. The component arrangement according to claim 14, wherein the first component and the second component electrically conductively connect to a common counter contact.

17. An optoelectronic component arrangement comprising:
a connection board comprising a first contact surface and a second contact surface electrically isolated from the first contact surface,
a first component that generates radiation and electrically conductively connects to the first contact surface, and
a second component that generates radiation and electrically conductively connects to the second contact surface,
wherein the first contact surface and the second contact surface electrically connect to one another when the connection board is in a fastened state on an installation board;
the first component and the second component electrically conductively connect to a common counter contact;
the connection board comprises a metal body and an insulation layer arranged on the metal body;
the metal body forms the common counter contact; and
the first contact surface and the second contact surface are arranged on a side of the insulation layer, said side being remote from the metal body.

18. The optoelectronic component arrangement according to claim 17, further comprising at least one opening formed in the connection board in a region of the connection board in which the metal body is not covered by the insulation layer so that the metal body is externally electrically contactable via a fastener extending through the opening.

19. An optoelectronic component arrangement comprising:
a circuit board comprising a first contact surface and a second contact surface electrically isolated from the first contact surface,
a first component that generates radiation and electrically conductively connects to the first contact surface, and
a second component that generates radiation and electrically conductively connects to the second contact surface,
wherein the first contact surface and the second contact surface electrically connect to one another when the circuit board is in a fastened state on an installation board, and
the first component and the second component comprise at least one luminescent diode chip,
wherein the circuit board comprises a metal body and an insulation layer arranged on the metal body.

20. An optoelectronic component arrangement comprising:
a connection board comprising a first contact surface and a second contact surface electrically isolated from the first contact surface,
a first component that generates radiation and electrically conductively connects to the first contact surface, and
a second component that generates radiation and electrically conductively connects to the second contact surface,
wherein the first contact surface and the second contact surface electrically connect to one another when the connection board is in a fastened state on an installation board,
the first component and the second component comprise at least one luminescent diode chip, and
the first component and the second component electrically conductively connect to a common counter contact.

* * * * *